United States Patent
Yang

(10) Patent No.: US 9,231,753 B2
(45) Date of Patent: *Jan. 5, 2016

(54) LOW POWER OVERSAMPLING WITH REDUCED-ARCHITECTURE DELAY LOCKED LOOP

(71) Applicant: Intel Corporation, Santa Clara, CA (US)

(72) Inventor: Wei-Lien Yang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/326,657

(22) Filed: Jul. 9, 2014

(65) Prior Publication Data

US 2014/0369400 A1    Dec. 18, 2014

Related U.S. Application Data

(63) Continuation of application No. 13/531,760, filed on Jun. 25, 2012, now Pat. No. 8,797,075.

(51) Int. Cl.
| | |
|---|---|
| H03L 7/06 | (2006.01) |
| H04L 7/00 | (2006.01) |
| H04L 25/49 | (2006.01) |
| H03L 7/081 | (2006.01) |
| H03L 7/16 | (2006.01) |

(52) U.S. Cl.
CPC ............ *H04L 7/0037* (2013.01); *H03L 7/0818* (2013.01); *H03L 7/16* (2013.01); *H04L 25/4902* (2013.01)

(58) Field of Classification Search
CPC ..................................................... H04L 7/0037
USPC .................................................. 327/156, 159
See application file for complete search history.

(56) References Cited

U.S. PATENT DOCUMENTS

| | | | | |
|---|---|---|---|---|
| 5,684,421 A | * | 11/1997 | Chapman et al. | 327/261 |
| 6,037,812 A | * | 3/2000 | Gaudet | 327/116 |
| 6,639,956 B1 | | 10/2003 | Song | |
| 6,775,345 B1 | | 8/2004 | Song | |
| 6,901,126 B1 | | 5/2005 | Gu | |
| 7,449,932 B2 | * | 11/2008 | Ikeda | 327/291 |
| 7,656,323 B2 | | 2/2010 | Bereza et al. | |
| 7,719,338 B2 | * | 5/2010 | Ikeda | 327/291 |

(Continued)

OTHER PUBLICATIONS

International Searching Authority, "Notification of Transmittal of the International Search Report and the Written Opinion of the International Searching Authority," mailed Oct. 14, 2013, in International application No. PCT/us2013/045323.

(Continued)

*Primary Examiner* — Ryan Jager
(74) *Attorney, Agent, or Firm* — Trop, Pruner & Hu, P.C.

(57) ABSTRACT

In one embodiment, an apparatus including a phase detector unit to determine a phase difference between an inverted reference clock signal and a feedback clock signal. The apparatus further includes a controller unit to generate a delay signal based on the phase difference. The apparatus further includes a set of voltage-controlled delay lines to generate phase outputs based on the delay signal, where the phase outputs are provided by the apparatus to a clock generator unit to generate an oversampled clock signal for data recovery by a receiver.

20 Claims, 12 Drawing Sheets

(56) References Cited

U.S. PATENT DOCUMENTS

| | | | |
|---|---|---|---|
| 8,065,130 B1 | 11/2011 | Brebner et al. | |
| 2002/0030522 A1 | 3/2002 | Nakamura | |
| 2002/0079938 A1* | 6/2002 | Saeki | 327/165 |
| 2007/0002992 A1 | 1/2007 | Sindalovsky et al. | |
| 2008/0272814 A1 | 11/2008 | Chiang et al. | |
| 2008/0298476 A1 | 12/2008 | Bereza et al. | |
| 2009/0147897 A1 | 6/2009 | Shin | |
| 2009/0180783 A1* | 7/2009 | Huang et al. | 398/155 |
| 2010/0289541 A1 | 11/2010 | Wu | |
| 2011/0050312 A1* | 3/2011 | Fujino | 327/237 |
| 2011/0170644 A1 | 7/2011 | Iqbal et al. | |
| 2011/0286562 A1* | 11/2011 | Jeon et al. | 375/371 |
| 2011/0292020 A1* | 12/2011 | Lee | 345/211 |
| 2012/0033774 A1* | 2/2012 | Tanaka et al. | 375/371 |
| 2012/0086485 A1 | 4/2012 | Trivedi et al. | |
| 2012/0099688 A1 | 4/2012 | Nishi | |
| 2012/0286821 A1* | 11/2012 | Hooi et al. | 326/38 |
| 2012/0306538 A1* | 12/2012 | Aryanfar et al. | 327/5 |
| 2013/0272368 A1* | 10/2013 | Yang | 375/238 |
| 2013/0326257 A1* | 12/2013 | Fujimoto | 713/400 |
| 2013/0342248 A1* | 12/2013 | Yang | 327/158 |
| 2013/0342249 A1* | 12/2013 | Yang | 327/158 |
| 2014/0002153 A1* | 1/2014 | Yang | 327/158 |

OTHER PUBLICATIONS

U.S. Patent and Trademark Office, Office Action mailed Sep. 12, 2013 with Reply filed Dec. 9, 2013 in U.S. Appl. No. 13/531,748.

International Patent Application Serial No. PCT/US2011/53738, entitled "Low Power Data Recovery Using Over-Clocking," filed Sep. 28, 2011, by Applicant Intel Corporation.

International Patent Application Serial No. PCT/US2011/65175, entitled "Low Power Transmitter for Generating Pulse Modulated Signals," filed Dec. 15, 2011, by Wei-Lien Yang.

* cited by examiner

LOW POWER OVERSAMPLING WITH REDUCED-ARCHITECTURE DELAY LOCKED LOOP

This application is a continuation of U.S. patent application Ser. No. 13/531,760, filed Jun. 25, 2012, the content of which is hereby incorporated by reference.

TECHNICAL FIELD

Embodiments relate to data recovery as executed by a computer system having superscalar architecture.

BACKGROUND

The International Organization for Standardization Open Systems Interconnection (ISO/OSI) model is a layered architecture that standardizes levels of service and types of interaction for systems exchanging information through a communications network. The ISO/OSI model separates computer-to-computer communications into seven layers or levels, each building upon the standards contained in the levels below it. The highest of the seven layers deals with software interactions at the application-program level. In contrast, the lowest level is the "physical layer" (PHY), which is hardware-oriented and deals with aspects of establishing and maintaining a physical link between communicating systems. Among specifications covered on the physical layer are cabling, electrical signals, and mechanical connections.

As the development of mobile device trends toward richer functionality (e.g., improved displays, cameras, peripherals, etc.) and media/content (e.g., more robust cloud-based services), mobile computing device platforms and architectures seek to accommodate greater bandwidth in the transfer of data between components. Mobile Industry Processor Interface (MIPI) Alliance is a working group that sets standards for mobile computing devices. Smart phones, personal digital assistants, laptops, tablets, and, more generally, mobile computing devices, may be designed with one or more MIPI configuration compliant components. Each component may implement a MIPI link.

DETAILED DESCRIPTION

The MIPI M-PHY physical layer specification (e.g., as defined by the MIPI Alliance specification for M-PHY of Feb. 8, 2011, approved Apr. 28, 2011) supports high-speed serial data rates across peripherals/components in mobile computing devices. An M-PHY link is a serial data connection between peripherals that includes two sublinks running in opposite directions. Each sublink constitutes one or more unidirectional point-to-point lanes running in the same direction. Each lane connects a transmitter and a receiver and is independent from other lanes in the same link as to operating mode and properties. Serial data is transferred over a lane using pulse width modulation signaling (PWM). The PWM signaling may operate at various data transfer speed ranges pursuant to one of the specification-defined gears (e.g., G1-G7).

Figure 1A:
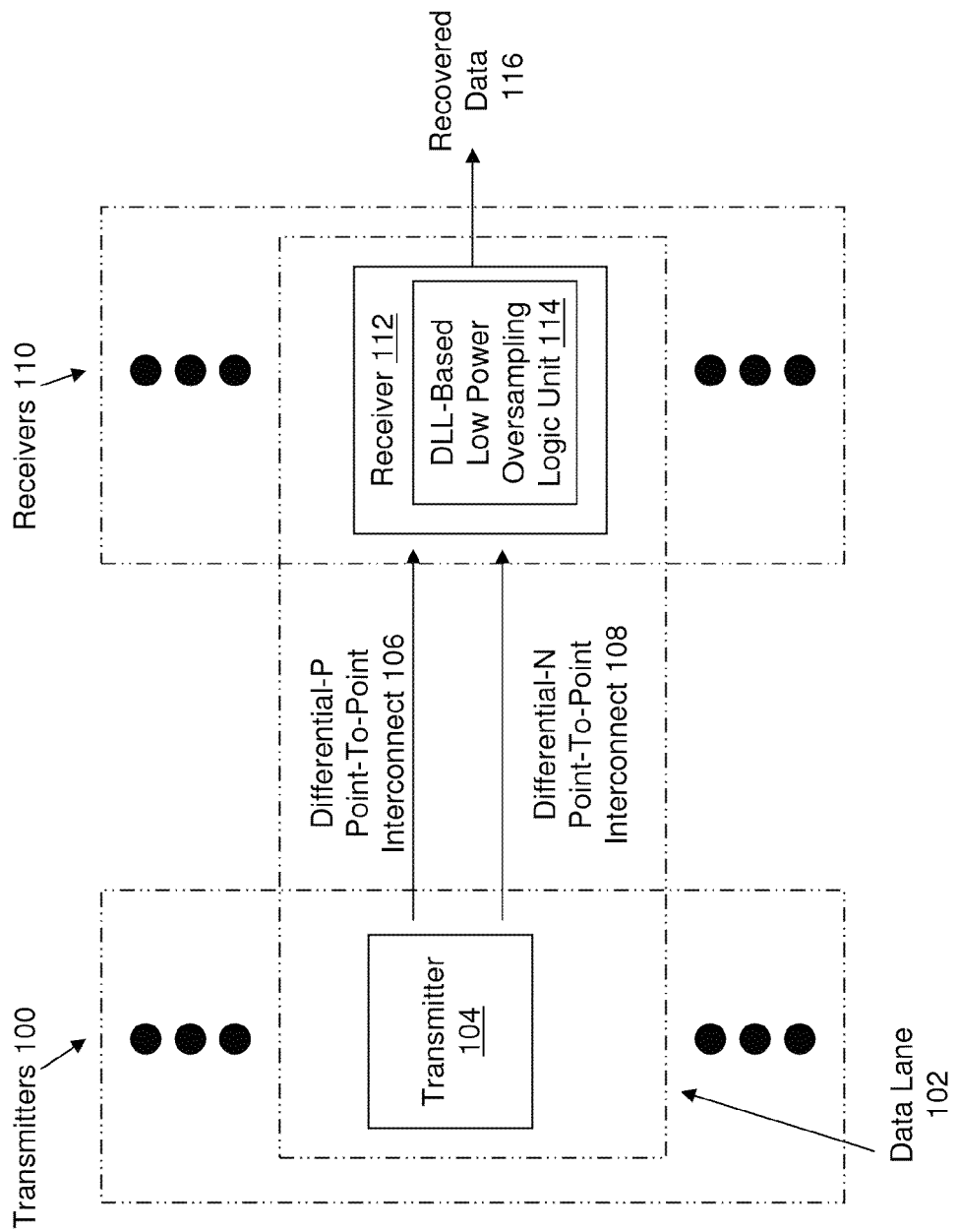
FIG. 1A is a block diagram of a system in accordance with one or more embodiments.

Referring now to FIG. 1A, shown is a block diagram of a system in accordance with one or more embodiments. Shown is a transmitter 104 and its corresponding receiver 112 as connected by two interconnects 106 and 108. Although the transmitter and receiver may be implemented according to various protocols such as a given low power protocol, the transmitter and receiver as shown in FIG. 1A may be MIPI M-PHY-based devices. A differential-p point-to-point interconnect 106 may be used to transmit a first differential PWM signal and the differential-n point-to-point interconnect 108 may be used to transmit a second differential PWM signal, thereby constituting a differential pair of signals. Together, the transmitter 104 and receiver 112, as bridged by interconnects 106 and 108, constitute a lane 102. While only one transmitter-receiver pair is explicitly shown, one skilled in the art will understand that many such transmitter-receiver pairs may exist to connect (e.g., via additional interconnects not shown) any two components or peripherals in a mobile computing device. The plurality of transmitter-receiver pairs is suggested by a set of transmitters 100 and a set of receivers 110 as shown in FIG. 1A.

In accordance with one or more embodiments, the PWM signals are received by the receiver 112 and then processed. By processing the signals, the receiver 112 is able to perform a data recovery function (e.g., as indicated by 116). In this manner, data is transferred from one component/peripheral to another at a high speed. A high speed, in accordance with some embodiments, means a variable speed based on PWM gear selection ranging between 3-576 MBPS (i.e., G1-G7 as described in the MIPI M-PHY specification). Specifically, in accordance with some embodiments, a delay locked loop (DLL)-based low power oversampling logic unit 114 (e.g., implemented in receiver 112) receives the signals from the transmitter 104 over the interconnects 106 and 108 and also performs the processing steps. Signal processing by the DLL-based low power oversampling logic unit 114 is further discussed in relation to the subsequent FIGs.

Figure 1B:
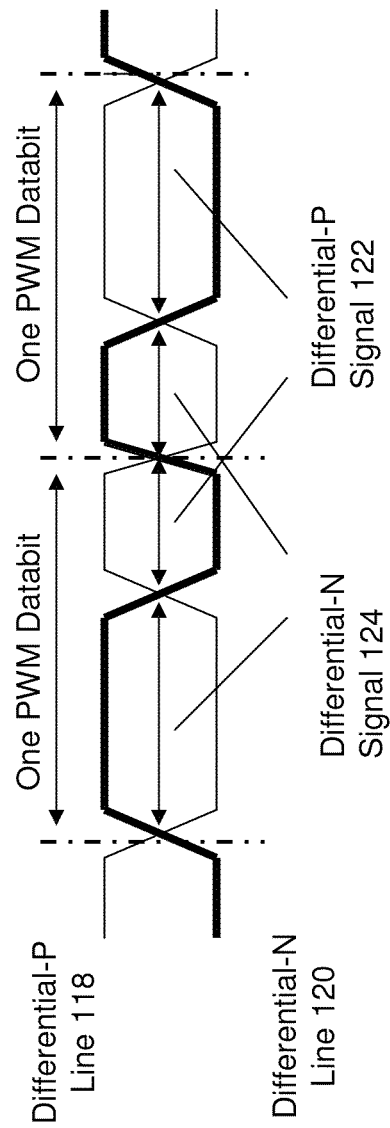
FIG. 1B is a timing diagram of a system in accordance with one or more embodiments.

Referring now to FIG. 1B, shown is a timing chart of a system in accordance with one or more embodiments. The timing chart shows an example of power states (i.e., voltage levels) of the interconnects 106 and 108 (e.g., as shown in FIG. 1A) with respect to time. By serving as a means for differential PWM signal transport, these interconnects constitute a differential-p line 118 and a differential-n line 120. The differential lines 118 and 120 may be sampled for a designated time period of data transfer between transmitter and receiver to determine how the transferred data (e.g., a single PWM databit) may be expressed. For example, the transferred databit may constitute a differential-p signal when the differential-p line 118 is in a high power state and the differential-n line 120 is in a low power state during the sampled time period. Otherwise, the transferred databit may constitute a differential-n signal when the differential-n line 120 is in a high power state and the differential-p line 118 is in a lower power state during the sampled time period.

Figure 2:
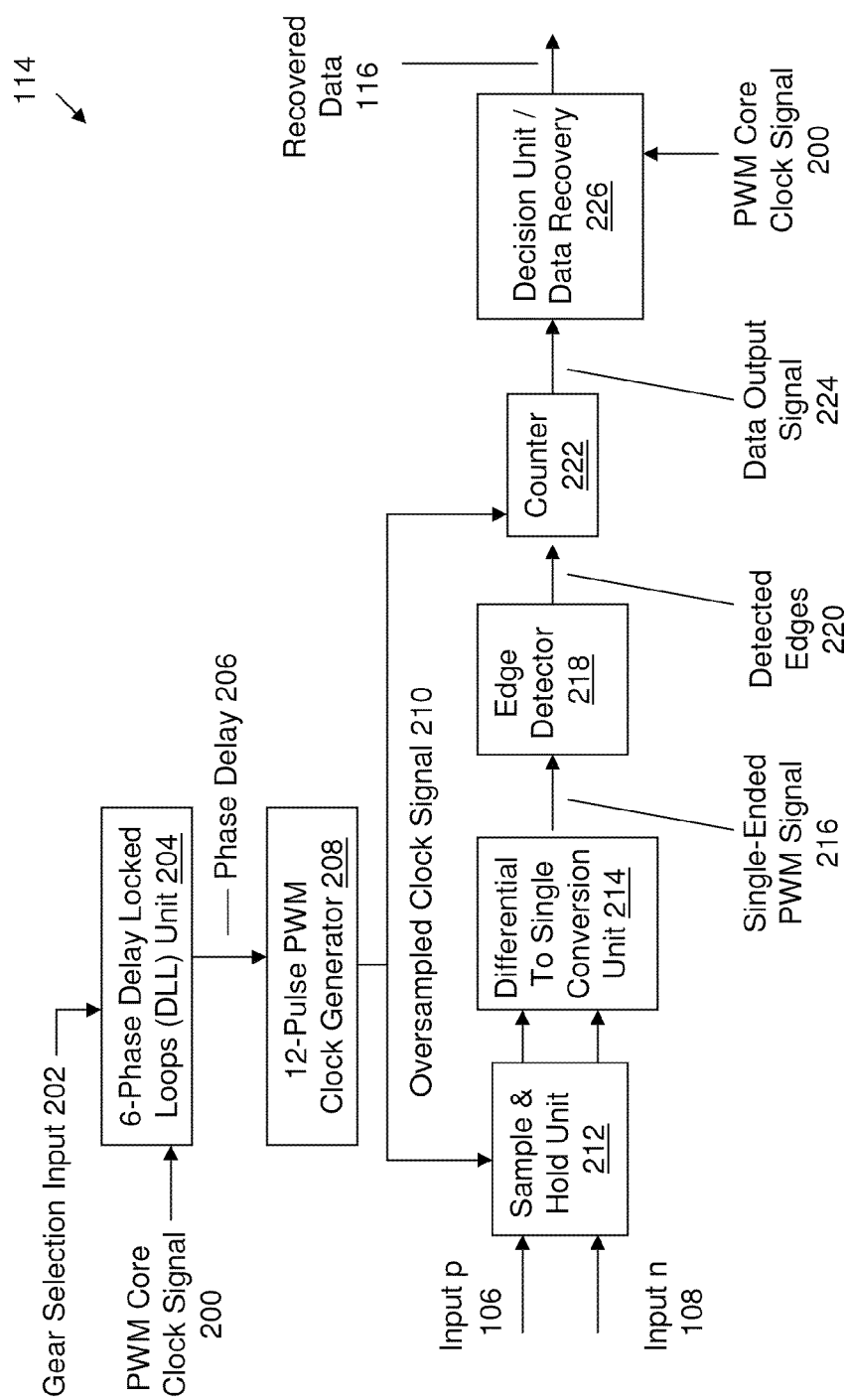
FIG. 2 is a block diagram of a system in accordance with one or more embodiments.

Referring now to FIG. 2, shown is a block diagram of a system in accordance with one or more embodiments. In accordance with some embodiments, the system features shown in FIG. 2 may comprise the DLL-based low power oversampling logic unit 114 discussed in relation to FIG. 1. In some embodiments, the DLL-based low power oversampling logic unit 114 may include a 6-phase delay locked loops (DLL) unit 204, a 12-pulse PWM clock generator 208, a sample & hold unit 212, a differential-to-single conversion unit 214, an edge detector 218, a counter 222, and a decision/data recovery unit 226.

In accordance with some embodiments, the 6-phase DLL unit 204 may receive a gear selection input 202. The gear selection input may be any identifier or other selective means used to identify any one of a number of gears. In accordance with some embodiments, a gear is one of the 7 gears as defined by the MIPI Alliance's M-PHY specification. The DLL unit 204 may also receive a PWM core clock signal 200 (i.e., a reference clock signal) as an input. Based on the gear selection input 202 and the PWM core clock signal 200, the DLL unit 204 may determine a phase delay output 206. The determination of the phase delay output 206 by the DLL unit 204 is further discussed in relation to FIG. 3A.

In accordance with some embodiments, the 12-pulse PWM clock generator 208 may receive the phase delay output 206 as an input. Based on the phase delay output 206, the 12-pulse PWM clock generator 208 may generate an oversampled clock signal 210 as an output. For example, the 12-pulse PWM clock generator 208 may generate a pulse at every rising and falling edge of a PWM core clock signal 200 (e.g., reference clock signal). As such, the reference clock signal 200 may be amplified by the oversampling logic of the PWM clock generator 208 to generate a clock signal 210 with an increased frequency. The 12-pulse PWM clock generator 208 may be any device or circuit that may be used to produce a timing signal for synchronizing operations.

In accordance with some embodiments, the sample & hold unit 212 may receive two differential PWM signals over interconnects 106 and 108 from a transmitter 104. The sample & hold unit 212 may also receive the oversampled clock signal 210 as an input. Based on these inputs 106, 108, 210, the sample & hold unit 212 may sample inputs 106 and 108 (i.e., the differential PWM signals) for some time period (e.g., a cycle or half a cycle) based on the oversampled clock signal 210 and then hold the inputs 106 and 108 for the like time period. After holding the inputs 106 and 108 for the designated time period, the sample & hold unit 212 subsequently transmits inputs 106 and 108 (i.e., the differential PWM signals) to the differential-to-single conversion unit 214. In one or more embodiments, the sample & hold unit 212 may be any device or circuit capable of sampling a series of input signals that are buffered and then released upon the completion of a specified timing period.

In accordance with some embodiments, the differential-to-single conversion unit 214 receives differential PWM signals 106 and 108 from the sample & hold unit 212. Further, the differential-to-single conversion unit 214 converts the two input signals 106 and 108 to a single-ended PWM signal 216. Upon conversion, the single-ended PWM signal 216 is an output provided to the edge detector 218.

In accordance with some embodiments, the edge detector 218 receives the single-ended PWM signal 216 as an input. The single-ended PWM signal 216 is processed to determine the occurrence of rising and falling edges in the signal 216. For example, the detection of a rising edge results in the issue of a count-up signal 220 by the edge detector 218. The detection of a falling edge results in the issue of a count-down signal 220 by the edge detector 218. In addition, the edge detector 218 may also generate a reset signal in addition to a count-down signal 220 upon detecting a falling edge for the single-ended PWM signal 216.

In accordance with some embodiments, the counter 222 receives the edge detection signals 220 as inputs. For example, the counter 222 may increase the count based on a received count-up signal 220 and decrease the count based on a received count-down signal 220. As such, the counter 222 can determine a data output signal 224 (i.e., a net count value). In some embodiments, the data output signal 224 is either a logical high value (e.g., "1") or a logical low value (e.g., "0") based on whether the count value is net positive or not.

In accordance with some embodiments, the decision/data recovery unit 226 receives the data output signal 224 and a PWM core clock signal 200 (e.g., reference clock signal). Based on the inputs 224 and 200, a data recovery step is performed. Said another way, data 116 is transmitted at a high speed (e.g., a speed corresponding to a PWM gear selection) across the lane in accordance with the M-PHY specification.

Figure 3A:
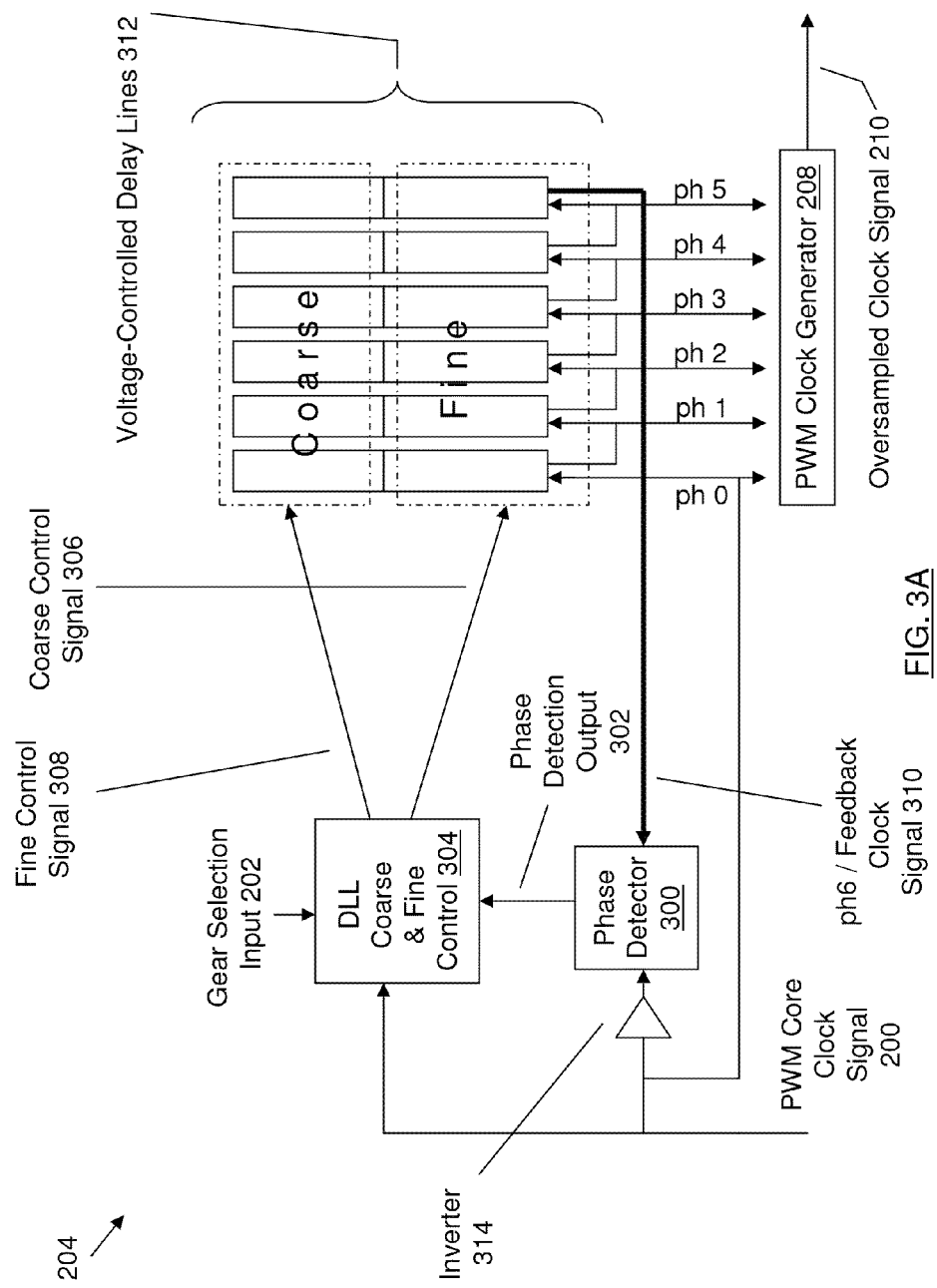
FIG. 3A is a block diagram of a system in accordance with one or more embodiments.

Referring now to FIG. 3A, shown is a block diagram of a system in accordance with one or more embodiments. In accordance with some embodiments, the system features shown in FIG. 3A may comprise the 6-phase delay locked loops (DLL) unit 204 discussed in relation to FIG. 2. Shown is a phase detector 300, a DLL coarse & fine control unit 304, a set of voltage-controlled delay lines 312, and a 12-pulse PWM clock generator 208.

In accordance with some embodiments, the phase detector 300 receives an inverted PWM core clock signal as an input. The PWM core clock signal 200 may be a reference clock signal in accordance with some embodiments. As such, in some embodiments, the PWM core clock signal 200 is provided from a source external to the DLL unit 204. Further, in some embodiments, a phase output (i.e., ph0) from a first voltage-controlled day line is the PWM core clock signal input to the phase detector 300. In all embodiments, an inverter device 314 may be used in accordance with some embodiments to invert the PWM core clock signal 200.

In accordance with some embodiments, the phase detector 300 receives a feedback clock signal 310 as an input. In such embodiments, the feedback clock signal is received by the phase detector 300 from a final voltage-controlled delay line (e.g., ph6 as shown in FIG. 3A).

In processing the inverted PWM core clock signal and the feedback clock signal 310, the phase detector 300 determines a phase difference between the rising edges of the signals (i.e., the inverted PWM core clock signal/ph0 and the feedback clock signal/ph6). Based on the determination, the phase detector 300 may generate and transmit an output 302 indicative of which of the two signals is the first to evidence a first rising edge.

In accordance with some embodiments, the DLL coarse & fine control unit 304 receives a phase detection output 302 (e.g., a phase difference as determined by phase detector 300), a PWM core clock signal 200 (e.g., a reference clock signal), and a gear selection input 202. In processing these inputs, the DLL coarse & fine control unit 304 determines a delay adjustment. The DLL coarse & fine control unit 304 may express larger adjustments using a coarse control signal 306 and smaller adjustments using a fine control signal 308. In some embodiments, the delay adjustment is applied to synchronize the PWM core clock signal 200 with the feedback clock signal 310.

Figure 6:
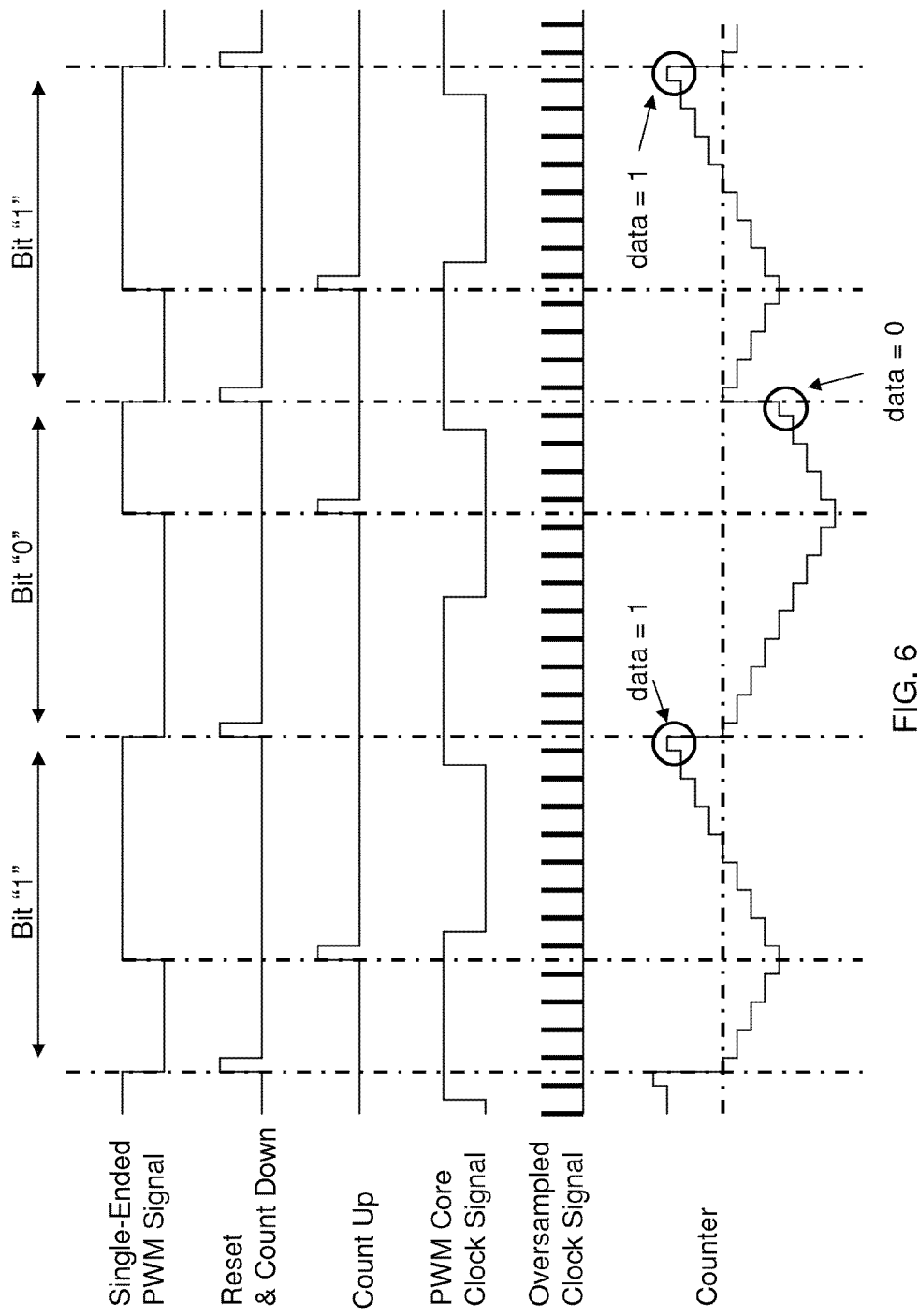
FIG. 6 is a block diagram of a processor core in accordance with one or more embodiments.

In accordance with some embodiments, the voltage-controlled delay lines 312 receive a coarse control signal 306 and/or a fine control signal 308. In some embodiments, the voltage-controlled delay lines 312 may be implemented as a set of delay buffers such that each delay buffer transmits one or more phase outputs (e.g., ph0-ph6 as shown in FIG. 3A). As shown in FIG. 3A, 6 phase outputs (e.g., ph0-ph5) are provided as inputs to the 12-pulse PWM clock generator 208. Moreover, the phase output from each delay buffer also is provided as an input to a next delay buffer (e.g., output ph1 from the first delay buffer is provided as an input to the second delay buffer), with the two exceptions: (i) the first buffer does not receive a phase output as an input but rather receives a coarse control signal 306 and/or a fine control signal 308; and (ii) the last buffer provides its phase output (i.e., ph6) as a feedback clock signal 310 to the phase detector 300 (i.e., since no subsequent delay buffer is available). In this way, the delay buffers may be said to have a cascading configuration such that delay signals 306 and 308 propagate through the voltage-controlled delay lines to generate 7 distinct phase outputs (e.g., ph0-ph6) at distinct times. Further detail as to the generated phase output signals is provided in relation to FIGS. 3B and 3C.

Figure 3B:
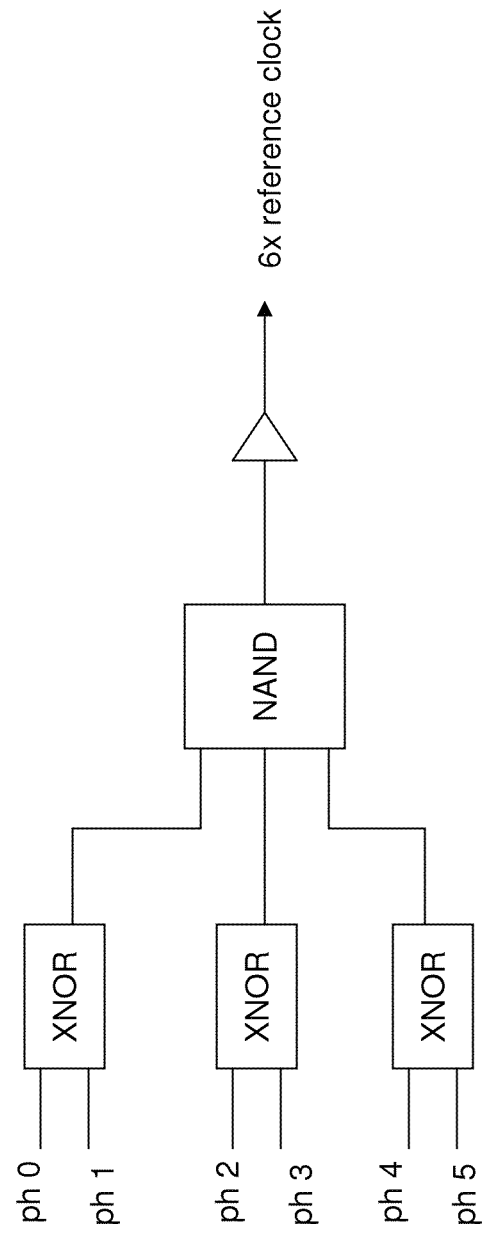
FIG. 3B is a block diagram of a system in accordance with one or more embodiments.
Figure 3C:
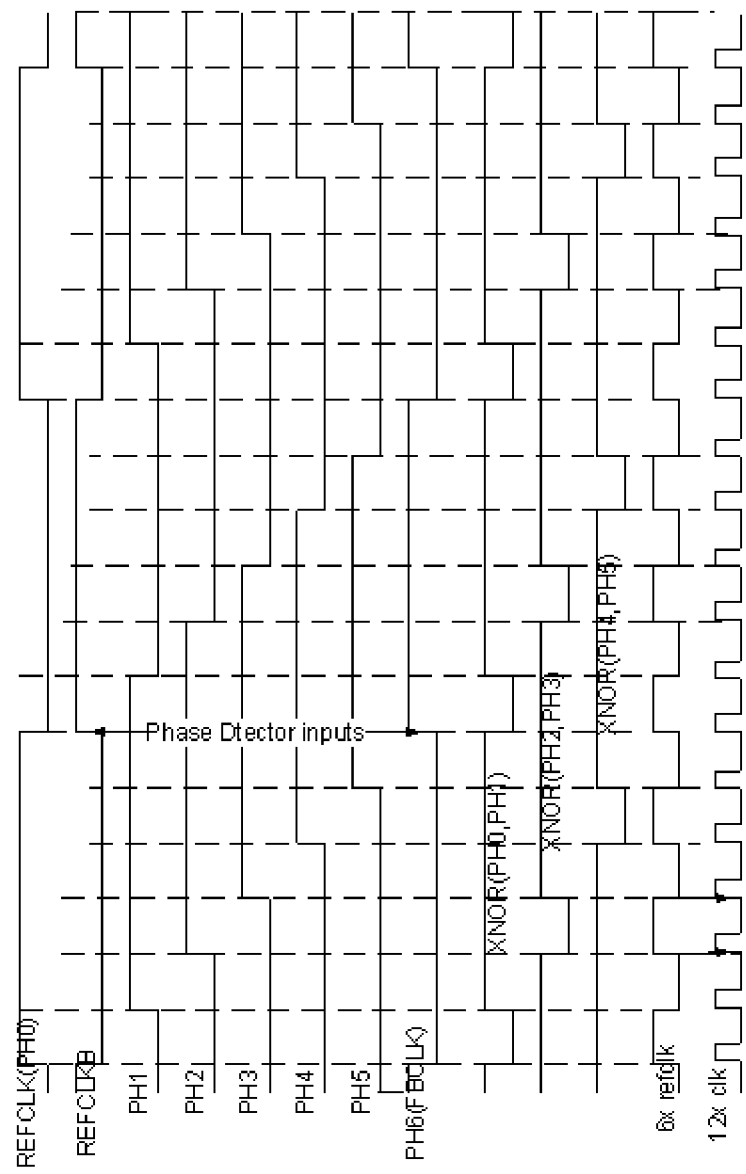
FIG. 3C is a timing diagram of a system in accordance with one or more embodiments.

In accordance with some embodiments, the 12-pulse PWM clock generator 208 receives the phase output signals (e.g., ph0-ph6 as shown in FIG. 3A) as inputs. On their own, ph1-ph6 are sufficient to generate a 6× oversampled clock signal. However, the 12-pulse PWM clock generator 208 may used an edge detector to generate a 12× oversampled clock signal 210 based on the 6× oversampled clock signal. As such, the DLL unit 204 may take a lower-frequency PWM core clock signal 200 (e.g., reference clock signal) and use it as a basis to generate a 12× oversampled clock signal 210. FIGS. 3B and 3C show how this may be achieved in accordance with some embodiments.

Referring now to FIG. 3B, shown is a block diagram of a system in accordance with one or more embodiments. In some embodiments, the block diagram shown in FIG. 3B constitutes a series of logic gates that use phase output signals (e.g., ph0-ph5, as generated by the voltage-controlled delay lines 312 shown in FIG. 3A) to generate a 6× oversampled clock signal. As shown in FIG. 3B, ph0 and ph1 are inputs to a first XNOR gate to generate a first output, ph2 and ph3 are inputs to a second XNOR gate to generate a second output, and ph4 and ph5 are inputs to a third XNOR gate to generate a third output. The three outputs (e.g., from the XNOR gates) are then provided as three inputs to a NAND gate. The output of the NAND gate is inverted to generate a 6× oversampled clock signal.

Referring now to FIG. 3C, shown is a timing diagram of a system in accordance with one or more embodiments. In accordance with some embodiments, FIG. 3C shows a reference clock signal (e.g., PWM core clock signal 200 as shown in FIG. 3A) in a first row and an inverted clock signal (e.g., the PWM core clock signal 200 of FIG. 3A as modified by an inverter 314). As discussed in relation to FIG. 3A, the reference clock signal may be from a source external to the DLL unit 204 in some embodiments. Further, in some embodiments, a phase output (i.e., ph0) from a first voltage-controlled day line may continue to function as the reference clock signal.

The third through eighth rows of FIG. 3C show the reference clock signal as subject to a series of phase-shifted delays. For example, in the third row, ph1 is generated by subjecting the reference clock signal to the first voltage-controlled delay line. As such, ph1 is one delay interval later than the reference clock signal of the first row. Likewise, ph2 shown in the fourth row is one delay interval removed from ph1 in the third row (i.e., two delay intervals removed from reference clock signal/ph0 shown in the first row) and so forth as the reference clock signal is propagated through the cascaded voltage-controlled delay lines 312 shown in FIG. 3A. The result is that ph1 (third row), ph2 (fourth row), ph3 (fifth row), ph4 (sixth row), ph5 (seventh row), and ph6 (eighth row) are each shifted one delay interval later than the previous phase output signal.

Further, the 6× oversampled clock signal is the product of phase outputs ph0-ph5 as shown by the logic expressed in FIG. 3B. The products of the XNOR gates shown in FIG. 3B are shown in the ninth through eleventh rows of FIG. 3C respectively. As FIG. 3B shows, these XNOR gate products are then combined as inputs to a NAND gate to generate the 6× oversampled clock signal, which is shown in the twelfth row of FIG. 3C. In some embodiments, the 6× oversampled clock signal may then be processed by an edge detector to generate a 12× oversampled clock signal as shown in the thirteenth row of FIG. 3C. That is, the 12× oversampled clock signal includes a pulse for every rising and falling edge in the 6× oversampled clock signal.

Accordingly, as shown in FIGS. 3A-3C, a DLL unit 204 may receive a reference clock signal and process it to generate a significantly more-frequent oversampled clock signal. For example, a 12× oversampled clock signal may be generated using merely 6 voltage-controlled delay lines and 6 phase outputs instead of 12 voltage-controlled delay lines and 12 phase outputs. Specifically, the PWM clock generator 208 shown in FIG. 3A may: (i) receive the phase output signals (i.e., ph0-ph5); (ii) process the phase output signals using the logic shown in FIG. 3B to generate a 6× oversampled clock signal; and (iii) process the 6× oversampled clock signal using an edge detector to generate a 12× oversampled clock signal. One skilled in the art will note that generating a 12× oversampled clock signal using less than 12 voltage-controlled delay lines introduces a savings in terms of power as less architectural features are active or necessary.

Figure 4:
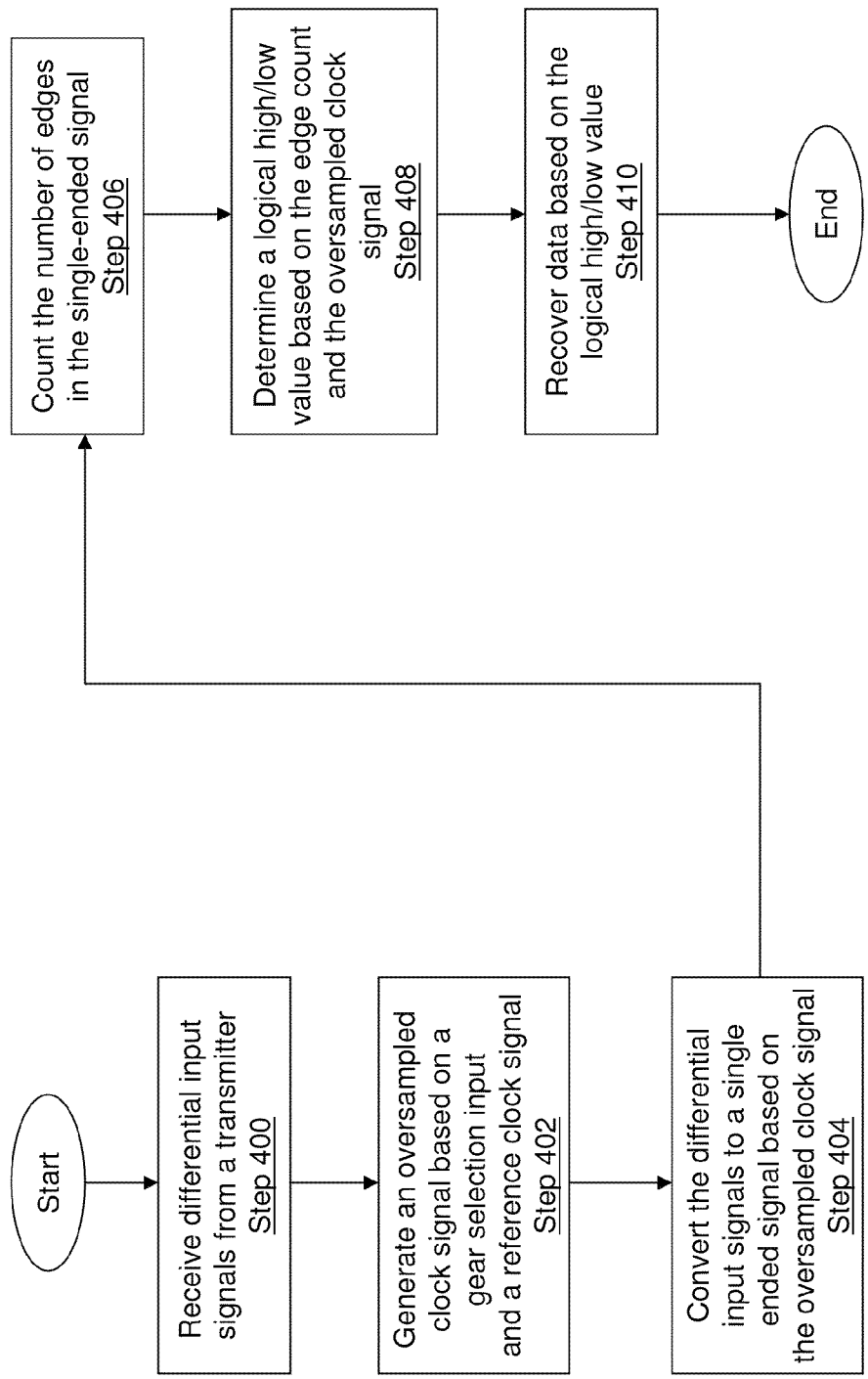
FIG. 4 is a flow diagram of a method in accordance with one or more embodiments.

Referring now to FIG. 4, shown is a flow diagram of a method in accordance with one or more embodiments. For example, the method shown in FIG. 4 may be performed by a system as described in relation to FIGS. 2 and 3. Beginning with Step 400, differential input signals are received from a transmitter. In some embodiments, the differential input signals are transmitted from a MIPI M-PHY transmitter 104 to a MIPI M-PHY receiver 112 as shown in FIG. 1. For example, in some embodiments, the differential input signals may be received by a DLL-based low power oversampling logic unit 114 (e.g., as shown in FIG. 1) or, more specifically, a sample & hold unit 212 (e.g., as shown in FIG. 2) in a DLL-based low power oversampling logic unit.

In Step 402, an oversampled clock signal may be generated based on a gear selection input and a reference clock signal (e.g., PWM core clock signal 200 as shown in FIGS. 2 and 3). In accordance with some embodiments, the gear selection input may be any identifier or datum indicative of an enumerated gear (e.g., G1-G7) defined by the MIPI Alliance's M-PHY specification or another specification. As discussed in relation to FIG. 3A, the oversampled clock signal 210 may be generated using a 6-phase DLL unit 204 in conjunction with a 12-pulse PWM clock generator 208. As such, the generated oversampled clock signal 210 may function at a higher frequency (e.g., 12×) than the reference clock signal. Step 402 is discussed in further detail in relation to FIG. 5.

In Step 404, differential input signals (e.g., received in Step 400) are converted to a single-ended PWM signal based on the oversampled clock signal. For example, in some embodiments, the differential input signals are sampled and held (e.g., by sample & hold unit 212 as shown in FIG. 2) for some determined time period. Further, when a rising edge is detected in the oversampled clock signal, the differential input signals are converted to a single-ended signal (e.g., by the conversion unit 214 shown in FIG. 2).

In Step 406, the number of rising and falling edges is counted for the single-ended PWM signal. In some embodiments, an edge detector 218 as shown in relation to FIG. 2 may be used to determine when a rising or falling edge registers in the single-ended PWM signal 216. Upon edge detection, the edge detector 218 may send a count-up or count-down signal to a counter 222.

In Step 408, a logical high or low value is determined based on the edge count and the oversampled clock signal. For example, in some embodiments, the counter 222 (e.g., as shown in FIG. 2) determines a bit value 224 that is representative of the single-ended PWM signal 216 based on all the count up/down signals provided by the edge detector 218. If the count is net-positive (i.e., the count-up signals exceed the count-down signals) for a given period of the core clock signal, then the bit value may be a logical high value (e.g., "1"); otherwise, the bit value may be expressed as a logical low value (e.g., "0"). As such, a bit value (e.g., as signified by data output signal 224) may be determined and transmitted for data recovery processing for each time period marked by the core clock signal 200.

In Step 410, the bit value determined in Step 408 is used as a basis for data recovery. For example, the bit value (e.g., data output signal 224 as shown in FIG. 2) may be transmitted from the counter 222 and provided as an input to the decision/data recovery unit 226. In processing the bit value, the the decision/data recovery unit 226 will decide whether or not to recover data. In this manner, data may be transmitted between a MIPI M-PHY transmitter 104 to a MIPI M-PHY receiver 110.

Figure 5:
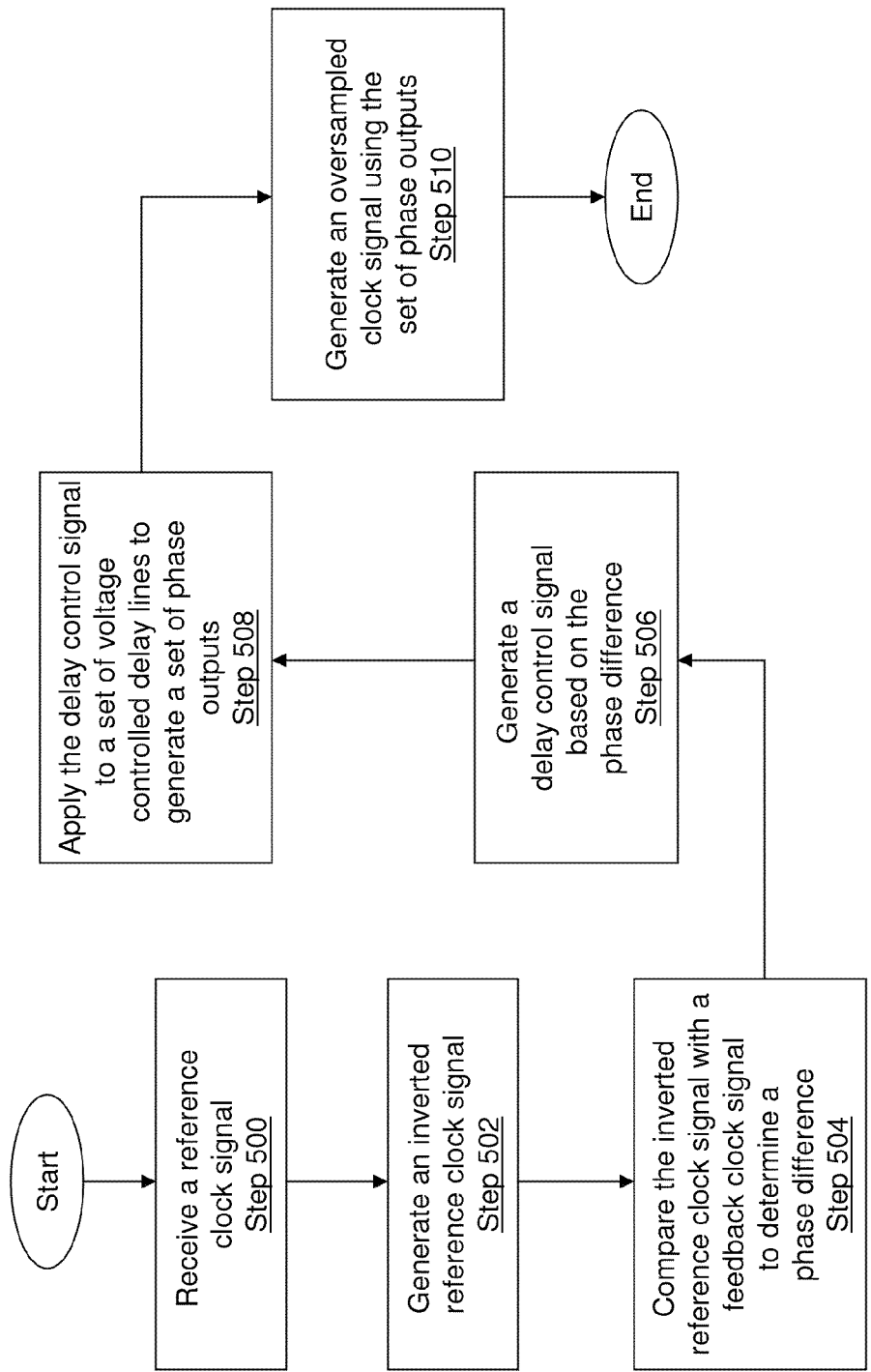
FIG. 5 is a timing diagram of a system in accordance with one or more embodiments.

Referring now to FIG. 5, shown is a flow diagram of a method in accordance with one or more embodiments. For example, the method shown in FIG. 5 may be performed by a system as described in relation to FIGS. 2 and 3. Specifically, the method shown in FIG. 5 may be performed as part of Step 402 as shown in FIG. 4. Beginning with Step 500, a reference clock signal is received. In accordance with some embodiments, the reference clock signal 200 (i.e., PWM core clock signal) is received by a delay locked loop unit 204 as shown in FIG. 2 (including a DLL coarse and fine control unit 304 as shown in FIG. 3A).

In Step 502, an inverted reference clock signal is generated. In accordance with some embodiments, an inverter device 314 (e.g., as shown in FIG. 3A) is used to invert a reference clock signal 200 received by the delay locked loop unit 204.

In Step 504, the inverted reference clock signal is compared with a feedback clock signal to determine a phase difference. In accordance with some embodiments, a phase detector 300 (e.g., as shown in FIG. 3A) may be used to determine the phase difference as described herein. As such, the feedback clock signal 310 may be phase output ph6 from the final voltage-controlled delay line as shown in FIG. 3A.

Further, the determined phase difference may be provided as an input to a DLL coarse and fine control unit 304 as shown in FIG. 3A.

In Step 506, a delay control signal is generated based on the phase difference. In accordance with some embodiments, a DLL coarse and fine control unit 304 (e.g., as shown in FIG. 3A) may receive a phase difference (e.g., phase detection output 302 as shown in FIG. 3A) as an input from a phase detector 300. Based upon the phase difference, the DLL coarse and fine control unit 304 may generate a fine control signal 308 to apply a delay adjustment in a first fixed timing increment to the timing of subsequently generated phase outputs. Further, the DLL coarse and fine control unit 304 may generate a coarse control signal 306 to apply a delay adjustment in a second fixed timing increment to the timing of subsequently generated phase outputs. In one or more embodiments, the second fixed timing increment associated with the coarse control signal 306 is larger than the first fixed timing increment associated with the fine control signal 308.

In Step 508, the delay control signal is applied to a set of voltage-controlled delay lines to generate a set of phase outputs. In some embodiments, a fine control signal 308 and/or a coarse control signal 306 (e.g., as generated by a DLL coarse and fine control unit as shown in FIG. 3A) is applied to the voltage-controlled delay lines shown in FIG. 3A to generate phase outputs ph0-ph6. In some embodiments, the phase outputs propagate through the voltage-controlled delay lines in the cascading manner previously described in relation to FIG. 3A (i.e., ph1 is the output of the first delay line and provided as an input to the second delay line, ph2 is the output of the second delay line and provided as an input to the third delay line, and so forth). Additionally, the phase outputs are also provided as inputs to a PWM clock generator 208 as shown in relation to FIG. 3A.

In Step 510, an oversampled clock signal is generated using the set of phase outputs. In some embodiments, a PWM clock generator 208 as shown in relation to FIG. 3A receives phase outputs ph0-ph5 and generates the oversampled clock signal 210 based on the received phase outputs.

Referring now to FIG. 6, shown is a timing diagram of a system in accordance with one or more embodiments. Shown is a series of square wave forms representative of the pulse-width modulated (PWM) signals involved in the previously-discussed systems and process (e.g., a MIPI M-PHY receiver architecture). In reference to the counter signal, the x-axis is time and the y-axis is a count value. In reference to all the other shown signals, the x-axis is also time but the y-axis is voltage.

The first waveform shown in FIG. 6 is the single-ended PWM signal. As discussed in relation to the previous FIGs., the single-ended PWM signal is provided when the differential to single-ended conversion unit 214 (e.g., as shown in FIG. 2) processes the two differential PWM signals (e.g., Input p and Input n as shown in FIG. 2 and received in Step 400).

The second and third waveforms shown in FIG. 6 are the count-down and count-up signals 220, respectively, generated by the edge detector 218's processing of the single-ended PWM signal. As such, the second waveform is shown to indicate a count-down spike whenever the single-ended PWM signal evidences falling edges. Similarly, the third waveform is shown to indicate a count-up spike whenever the single-ended PWM signal evidences rising edges.

The fourth and fifth waveforms shown in FIG. 6 are the PWM core clock signal (i.e., clock reference signal) and oversampled clock signal respectively. As FIG. 5 shows, the oversampled clock signal functions at a greater frequency than the clock reference signal.

The sixth and final waveform shown in FIG. 6 is the counter status. In some embodiments, the count is incremented, decremented, or reset on the basis of count-up and count-down/reset signals generated by the edge detector 218. Accordingly, the present bit value maintained by the counter 222 at the end of each timing period marked by the reference clock signal is translated into a logical high or low value for sending to the decision/data recovery unit 226. For example, the counter value is positive at the end of the first and third timing periods; as such, the bit value sent from the counter 222 to the decision/data recovery unit 226 is "1" or a high logical value. Conversely, counter value is negative at the end of the second timing period; as such, the bit value sent from the counter 222 to the decision/data recovery unit 226 is "0" or a low logical value. As previously discussed, the decision/data recovery unit 226 performs or does not perform data recovery on the basis of the bit value received from the counter 222.

Figure 7:
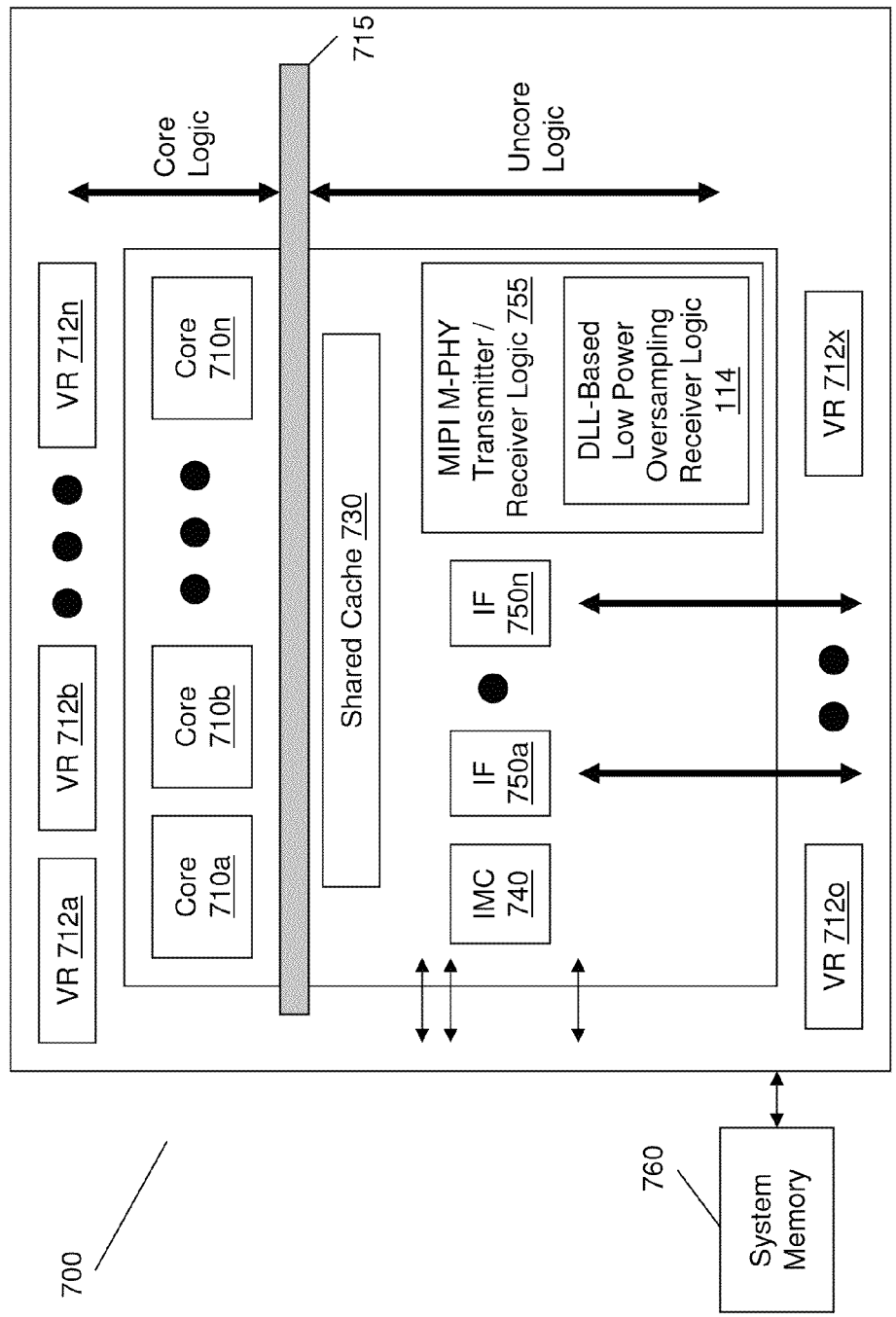
FIG. 7 is a block diagram of a system in accordance with one or more embodiments.

Referring now to FIG. 7, shown is a block diagram of a processor in accordance with one or more embodiments. As shown in FIG. 7, processor 700 may be a multicore processor including a plurality of cores 710a-710n. Each core may be associated with a corresponding voltage regulator 712a-712n. The various cores may be coupled via an interconnect 715 to an uncore logic that includes various components. As seen, the uncore logic may include a shared cache 730 which may be a last level cache. In addition, the uncore logic may include an integrated memory controller 740, various interfaces 750 and transmitter and receiver logic 755.

In various embodiments, transmitter and receiver logic 755 may include delay locked loop (DLL)-based lower power oversampling receiver logic 114 that in one embodiment may include hardware to execute firmware and/or software to perform the steps and functions described in relation to the previous FIGs. Specifically, the DLL-based low power oversampling receiver logic 114 shown in FIG. 7 may include features and logic as discussed in relation to FIGS. 2 and 3. In this way, the DLL-based low power oversampling receiver logic 114 can provide for high speed data transfer between components and across the physical layer of a mobile computing device.

With further reference to FIG. 7, processor 700 may communicate with a system memory 760, e.g., via a memory bus. In addition, by interfaces 750, connection can be made to various off-chip components such as peripheral devices, mass storage and so forth. While shown with this particular implementation in the embodiment of FIG. 7, the scope of the various embodiments discussed herein is not limited in this regard.

Figure 8:
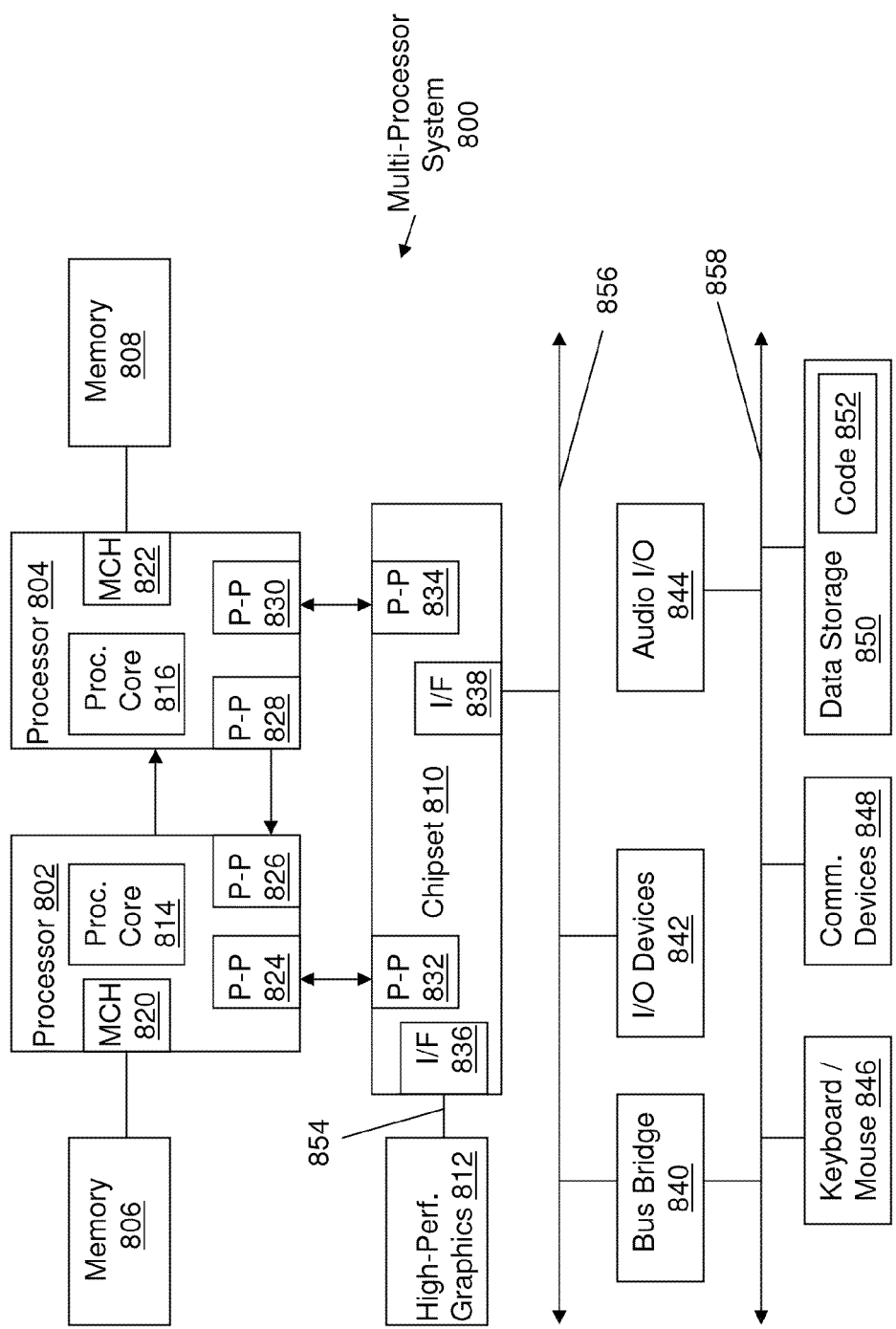
FIG. 8 is a block diagram of a system in accordance with one or more embodiments.

Referring now to FIG. 8, shown is a block diagram of a system in accordance with one or more embodiments. As shown in FIG. 8, a multiprocessor system 800 is a point-to-point interconnect system, and includes a first processor 802 and a second processor 804 coupled via a point-to-point interconnect. As shown in FIG. 8, each of processors 802 and 804 may be multicore processors, including first and second processor cores (i.e., processor cores 814 and 816), although potentially many more cores may be present in the processors.

Still referring to FIG. 8, first processor 802 further includes a memory controller hub (MCH) 820 and point-to-point (P-P) interfaces 824 and 826. Similarly, second processor 804 includes a MCH 822 and P-P interfaces 828 and 830. As shown in FIG. 8, MCH's 820 and 822 couple the processors to respective memories, namely a memory 806 and a memory 808, which may be portions of system memory (e.g., DRAM) locally attached to the respective processors. First processor 802 and second processor 804 may be coupled to a chipset 810 via P-P interconnects 824 and 830, respectively. As shown in FIG. 8, chipset 810 includes P-P interfaces 832 and 834.

Furthermore, chipset 810 includes an interface 836 to couple chipset 810 with a high performance graphics engine 812 by a P-P interconnect 854. In turn, chipset 810 may be coupled to a first bus 856 via an interface 838. As shown in FIG. 8, various input/output (I/O) devices 842 may be coupled to first bus 856, along with a bus bridge 840 which couples first bus 856 to a second bus 858. Various devices may be coupled to second bus 858 including, for example, a keyboard/mouse 846, communication devices 848 and a data storage unit 850 such as a disk drive or other mass storage device which may include code 852, in one embodiment. The code, when executed, may provide for the execution of steps and functionality as described in relation to the earlier FIGs. Further, an audio I/O 844 may be coupled to second bus 858. Embodiments can be incorporated into other types of systems including mobile devices such as a smart cellular telephone, tablet computer, netbook, ultrabook™, or so forth.

Embodiments may be implemented in code and may be stored on a non-transitory storage medium (e.g., machine-readable storage medium) having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions. Moreover, the embodiments may be implemented in code as stored in a microcontroller for a hardware device.

Figure 9:
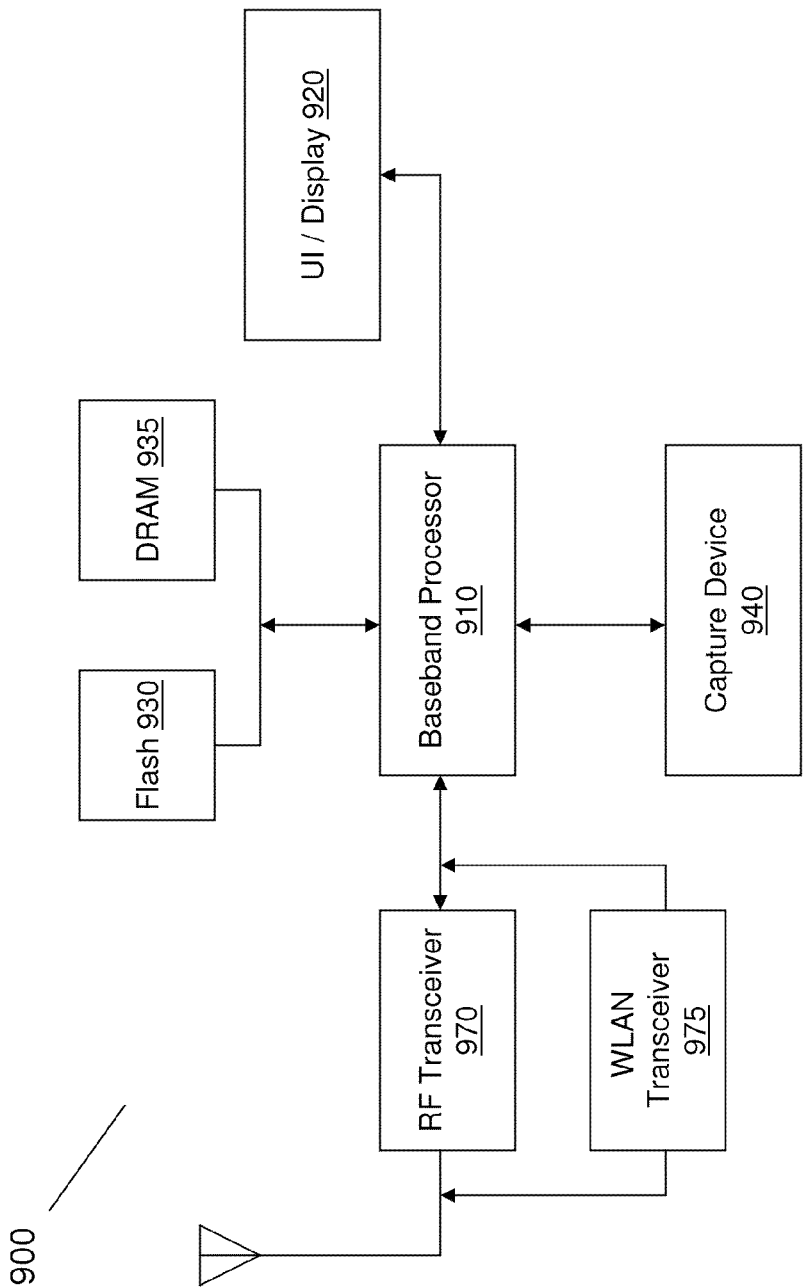
FIG. 9 is a block diagram of an example system in accordance with one embodiment of the present invention.

Referring now to FIG. 9, shown is a block diagram of an example system 900 with which embodiments can be used. As seen, system 900 may be a smartphone or other wireless communicator. As shown in the block diagram of FIG. 9, system 900 may include a baseband processor 910 which may be a multicore processor that can handle both baseband processing tasks as well as application processing. Thus baseband processor 910 can perform various signal processing with regard to communications, as well as perform computing operations for the device. In turn, baseband processor 910 can couple to a user interface/display 920 which can be realized, in some embodiments by a touch screen display. In addition, baseband processor 910 may couple to a memory system including, in the embodiment of FIG. 9 a non-volatile memory, namely a flash memory 930 and a system memory, namely a dynamic random access memory (DRAM) 935. As further seen, baseband processor 910 can further couple to a capture device 940 such as an image capture device that can record video and/or still images.

To enable communications to be transmitted and received, various circuitry may be coupled between baseband processor 910 and an antenna 980. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Other wireless communications such as receipt or transmission of radio signals, e.g., AM/FM, or global positioning satellite (GPS) signals may also be provided. In addition, via WLAN transceiver 975, local wireless signals, such as according to a Bluetooth™ standard or an IEEE 802.11 standard such as IEEE 802.11a/b/g/n can also be realized. Although shown at this high level in the embodiment of FIG. 9, understand the scope of the present invention is not limited in this regard.

The following clauses and/or examples pertain to further embodiments:

One example embodiment may be an apparatus that includes a phase detector unit to determine a phase difference between an inverted reference clock signal and a feedback clock signal. The apparatus may further include a controller unit to generate a delay signal based on the phase difference. The apparatus may further include a set of voltage-controlled delay lines to generate a plurality of phase outputs based on the delay signal wherein each voltage-controlled delay line transmits two or more of the plurality of phase outputs. The plurality of phase outputs may be provided to a clock generator unit to generate an oversampled clock signal for data recovery by a receiver. The controller unit may receive a gear selection input. The gear selection input may identify one of a plurality of speed ranges according to a lower power communication specification. A first delay line in the set of voltage-controlled delay lines may receive the delay signal from the controller unit and make a delay adjustment. The delay adjustment may be based on a coarse delay time period and a fine delay time period. The first delay line may provide a first phase output to both the clock generator unit and a second delay line in the set of voltage-controlled delay lines. A final delay line in the set of voltage-controlled delay lines may provide a second phase output to the phase detector. The second phase output may be the feedback clock signal. The phase difference may indicate a timing differential between the reference clock signal and the feedback clock signal. The set of voltage-controlled delay lines may be implemented using a delay-locked loop circuit. The delay-locked loop circuit may be a digital delay-locked loop circuit. The receiver may be a MIPI M-PHY receiver.

Another example embodiment may be a system comprising a system on a chip. The system on a chip may include at least one core having at least one execution unit and receiver logic. The receiver logic may include a digital delay-locked loop circuit to receive a reference pulse-width modulated (PWM) clock signal and a gear selection input. The delay-locked loop circuit may invert the reference PWM clock signal. The digital delay-locked loop circuit may determine a phase difference between the inverted reference PWM clock signal and a feedback clock signal. The digital delay-locked loop circuit may generate a plurality of phase output signals based on the phase difference. The receiver logic my further include a clock generator device to generate an oversampled clock signal based on the plurality of phase output signals. The oversampled clock signal may be used for data recovery by the receiver. The system may include a wireless device coupled to the system on a chip via an interconnect. The interconnect may be used to communicate data between the wireless device and the receiver logic of the system on a chip. The system may include a sample and hold unit to receive two differential input signals from the transmitter logic. The sample and hold unit may sample the two differential input signals for a first fixed time period. The sample and hold unit may buffer the two differential input signals for a second fixed time period. The sample and hold unit may send the two differential input signals to a conversion unit based on a frequency for the oversampled clock signal. The system may include a conversion unit to receive two differential input signals originating from the transmitter logic. The conversion unit may generate a single-ended PWM signal based on the two differential input signals. The system may include an edge detector unit to receive a single-ended PWM signal. The edge detector may generate and send a first type of signal when the single-ended PWM signal features a rising edge. The edge detector may generate an send a second type of signal when the single-ended PWM signal features a falling edge. The system may include a counter unit to receive the first type of signal and increment a bit value. The counter unit may receive the second type of signal and decrement the bit value. The counter unit may reset the bit value upon receipt of the second type of signal. The system may include a decision unit to receive the bit value. Based on the bit value, the decision unit may determine whether to recover at least one datum. The counter unit may send the bit value to the decision unit based on a frequency for the oversampled clock signal.

Another example embodiment may be a method. The method may involve determining a phase difference between an inverted reference clock signal and a feedback clock signal. The method may involve generating a delay signal based on the phase difference. The method may involve generating a plurality of phase outputs using a delay-locked loop circuit. The method may involve generating an oversampled clock signal based on the plurality of phase outputs. The oversampled clock signal may be used in performing data recovery by the receiver. The method may involve receiving differential signals from a transmitter. The method may involve sampling the differential signals for a fixed time period. The method may involve buffering the differential signals for the fixed time period. The method may involve converting the differential signals to a single-ended pulse-width modulated (PWM) signal. The method may involve processing the single-ended PWM signal to determine the number of rising and falling edges for a timing cycle based on a frequency for the oversampled clock signal. The method may involve determining a bit value for the single-ended PWM signal based on the number of rising and falling edges for the timing cycle. The method may involve performing a data recovery operation based on the bit value. The receiver may be a MIPI M-PHY receiver.

Another example embodiment may be a microcontroller executing in relation to a lower power oversampling logic unit, such that the microcontroller is arranged to perform the above-described method.

Another example embodiment may be a communication device arranged to perform the above-described method.

Another example embodiment may be at least one machine readable medium comprising a plurality of instructions that, in response to being executed on a computing device, cause the computing device to carry out the above-described method.

While a limited number of embodiments have been explicitly shown, those skilled in the art will appreciate numerous modifications and variations therefrom. It is intended that the appended claims cover all such modifications and variations as fall within the true spirit and scope of the described embodiments.

What is claimed is:
1. A mobile system comprising:
a radio frequency (RF) transceiver to communicate wirelessly via an antenna;

a baseband processor coupled to the RF transceiver, the baseband processor including at least one core and a receiver logic, the receiver logic comprising:
   a phase detector unit to determine a phase difference between an inverted reference clock signal and a feedback clock signal;
   a controller unit to generate a delay signal based on the phase difference; and
   a set of voltage-controlled delay buffers to generate a plurality of phase outputs based on the delay signal, the plurality of phase outputs provided to a clock generator unit to generate an oversampled clock signal for data recovery; and
a touchscreen display coupled to the baseband processor.

2. The mobile system of claim 1, the controller unit further to receive a gear selection input.

3. The mobile system of claim 2, the gear selection input to identify one of a plurality of speed ranges according to a low power communication specification.

4. The mobile system of claim 1, wherein a first delay buffer in the set of voltage-controlled delay buffers is to receive the delay signal from the controller unit and make a delay adjustment, wherein the delay adjustment is based on one of a coarse delay time period and a fine delay time period.

5. The mobile system of claim 4, the first delay buffer to provide a first phase output to both the clock generator unit and a second delay buffer in the set of voltage-controlled delay buffers.

6. The mobile system of claim 5, wherein a final delay buffer in the set of voltage-controlled delay buffers is to provide a second phase output to the phase detector, and wherein the second phase output is the feedback clock signal.

7. The mobile system of claim 1, wherein the phase difference indicates a timing differential between the inverted reference clock signal and the feedback clock signal.

8. The mobile system of claim 1, further comprising a delay-locked loop circuit including the set of voltage controlled delay buffers.

9. The mobile system of claim 8, wherein the delay-locked loop circuit is a digital delay-locked loop circuit.

10. The mobile system of claim 1, wherein the receiver logic is compliant with a Mobile Industry Processor Interface (MIPI) Alliance specification.

11. The mobile system of claim 1, wherein the mobile system comprises a smartphone.

12. The mobile system of claim 1, wherein the mobile system comprises a tablet computer.

13. A system comprising:
a multicore processor including a plurality of cores and a receiver logic, the receiver logic comprising:
   a digital delay-locked loop circuit to:
      receive and invert a reference pulse-width modulated (PWM) clock signal and a gear selection input;
      determine a phase difference between the inverted reference PWM clock signal and a feedback clock signal; and
      generate a plurality of phase output signals based on the phase difference; and
   a clock generator device to generate an oversampled clock signal based on the plurality of phase output signals, the oversampled clock signal to be used for data recovery by the receiver logic; and
a disk drive coupled to the multicore processor configured to store code to execute on the multicore processor; and
wherein the system does not include a radio hardware configured for wireless voice communication.

14. The system of claim 13, wherein the receiver logic further comprises:
a sample and hold unit to:
   receive two differential input signals;
   sample the two differential input signals for a first fixed time period; and
   hold the two differential input signals for a second fixed time period.

15. The system of claim 13, wherein the receiver logic further comprises:
a conversion unit to:
   receive two differential input signals; and
   generate a single-ended PWM signal based on the two differential input signals.

16. The system of claim 15, further comprising:
an edge detector unit to:
   receive the single-ended PWM signal;
   generate and send a first type of signal when the single-ended PWM signal features a rising edge; and
   generate and send a second type of signal when the single-ended PWM signal features a falling edge.

17. The system of claim 13, wherein the system comprises a tablet computer.

18. A machine-readable medium having stored thereon instructions, which if performed by a machine cause the machine to perform a method comprising:
determining a phase difference between an inverted reference clock signal and a feedback clock signal;
generating a delay signal based on the phase difference;
generating a plurality of phase outputs using a delay-locked loop circuit; and
generating an oversampled clock signal based on the plurality of phase outputs, the oversampled clock signal for use in performing data recovery by a receiver.

19. The machine-readable medium of claim 18, wherein the method further comprises:
receiving differential signals from a transmitter;
sampling the differential signals for a fixed time period; and
buffering the differential signals for the fixed time period.

20. The machine-readable medium of claim 19, wherein the method further comprises:
converting the differential signals to a single-ended pulse-width modulated (PWM) signal;
processing the single-ended PWM signal to determine the number of rising and falling edges for a timing cycle based on a frequency for the oversampled clock signal;
determining a bit value for the single-ended PWM signal based on the number of rising and falling edges for the timing cycle; and
performing a data recovery operation based on the bit value.

* * * * *